United States Patent
Matsushima et al.

(10) Patent No.: US 8,299,510 B2
(45) Date of Patent: Oct. 30, 2012

(54) SOLID STATE IMAGING DEVICE AND FABRICATION METHOD FOR THE SAME

(75) Inventors: Osamu Matsushima, Kyoto-fu (JP); Masaki Takaoka, Kyoto-fu (JP); Kenichi Miyazaki, Kyoto-fu (JP); Shogo Ishizuka, Ibaraki (JP); Keiichiro Sakurai, Ibaraki (JP); Shigeru Niki, Ibaraki (JP)

(73) Assignees: Rohm Co., Ltd., Kyoto-fu (JP); National Institute of Advanced Industrial Science and Technology, Tokyo (JP)

( * ) Notice: Subject to any disclaimer, the term of this patent is extended or adjusted under 35 U.S.C. 154(b) by 397 days.

(21) Appl. No.: 12/525,357

(22) PCT Filed: Feb. 1, 2008

(86) PCT No.: PCT/JP2008/051649
§ 371 (c)(1),
(2), (4) Date: Jul. 31, 2009

(87) PCT Pub. No.: WO2008/093834
PCT Pub. Date: Aug. 7, 2008

(65) Prior Publication Data
US 2010/0102368 A1    Apr. 29, 2010

(30) Foreign Application Priority Data
Feb. 2, 2007   (JP) ................. 2007-024611

(51) Int. Cl.
*H01L 31/062* (2012.01)
*H01L 31/113* (2006.01)
(52) U.S. Cl. ................ 257/290; 257/291; 257/E31.027
(58) Field of Classification Search .......... 257/290, 257/291, 292, 293, 444, 613, E31.008, E31.027, 257/E31.08; 438/95
See application file for complete search history.

(56) References Cited

U.S. PATENT DOCUMENTS

| 4,360,821 A | 11/1982 | Tsukada et al. |
| 4,412,236 A * | 10/1983 | Sasano et al. ............... 257/294 |
| 2004/0261841 A1* | 12/2004 | Negami et al. ............... 136/262 |

(Continued)

FOREIGN PATENT DOCUMENTS

JP    55-039404    3/1980

(Continued)

OTHER PUBLICATIONS

Jahagirdar. A., et al., "ole of i-Zn in optimizing open circuit voltage of CIGS2 and CIGS thin film solar cells," Photovoltaic Energy Conversion, Conference Record of the 2006 IEEE 4$^{th}$ World Conference, vol. I, pp. 557-559 (2006).

*Primary Examiner* — Chuong A Luu
*Assistant Examiner* — Nga Doan
(74) *Attorney, Agent, or Firm* — Fish & Richardson P.C.

(57) ABSTRACT

A solid state imaging device with an easy structure in which have the high sensitivity which reaches the wide wavelength region from visible light to near infrared light wavelength region, and dark current is reduced, and a fabrication method for the same, are provided.

A solid state imaging device and a fabrication method for the same, the solid state imaging device comprising: a circuit unit formed on a substrate; and a photoelectric conversion unit including a lower electrode layer placed on the circuit unit, a compound semiconductor thin film of chalcopyrite structure which is placed on the lower electrode layer and functions as an optical absorption layer, and an optical transparent electrode layer placed on the compound semiconductor thin film, wherein the lower electrode layer, the compound semiconductor thin film, and the optical transparent electrode layer are laminated one after another on the circuit unit.

9 Claims, 11 Drawing Sheets

U.S. PATENT DOCUMENTS

2009/0217969 A1 * 9/2009 Matsushima et al. ......... 136/252

FOREIGN PATENT DOCUMENTS

| | | |
|---|---|---|
| JP | 07-226410 | 8/1995 |
| JP | 09-186351 | 7/1997 |
| JP | 11-150282 | 6/1999 |
| JP | 2000-332280 | 11/2000 |
| JP | 2001-144279 | 5/2001 |
| JP | 2004-095931 | 3/2004 |
| WO | WO 2007/052667 | 5/2007 |

* cited by examiner

FIG. 4
(a) 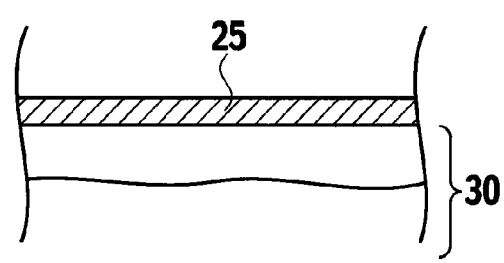
(e) 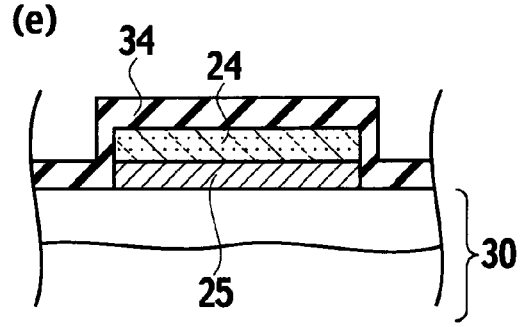
(b) 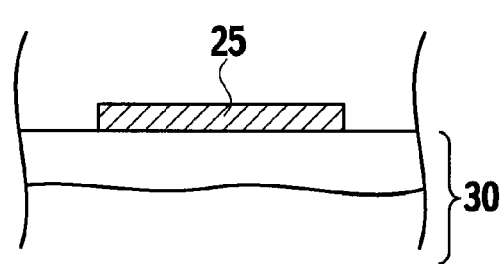
(f) 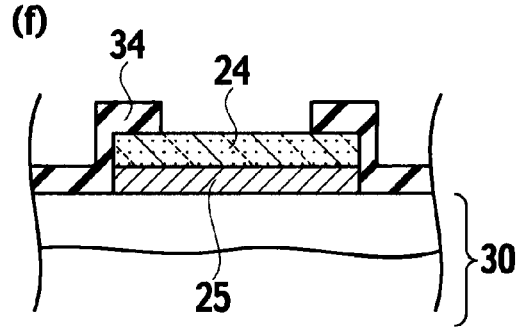
(c) 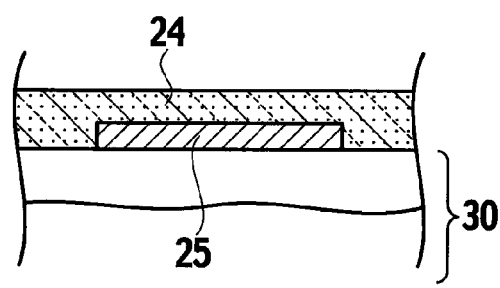
(g) 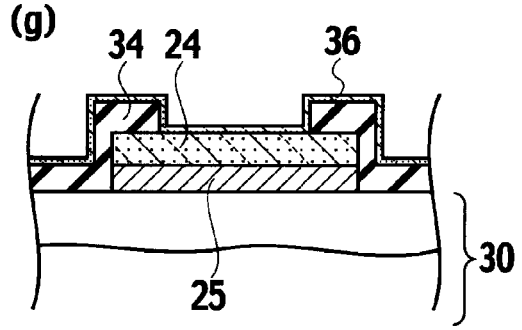
(d) 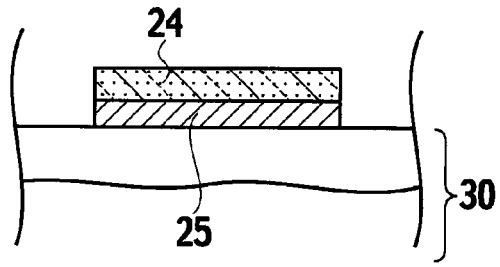
(h) 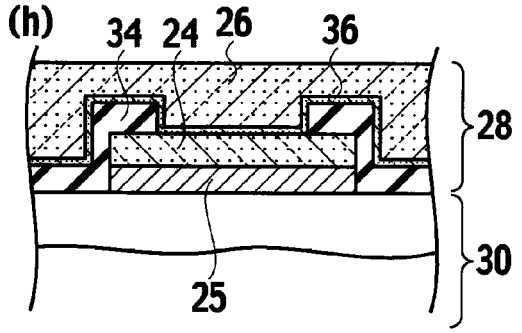

FIG. 5
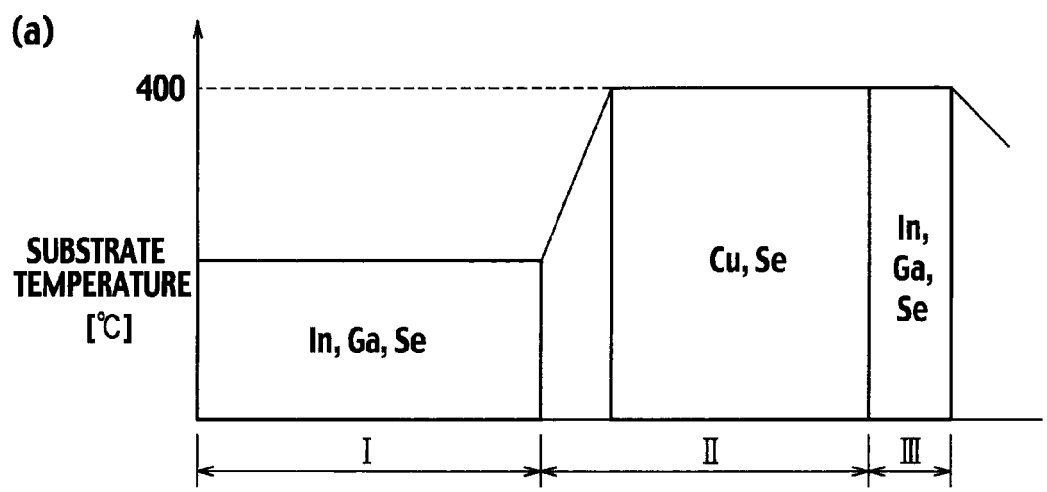
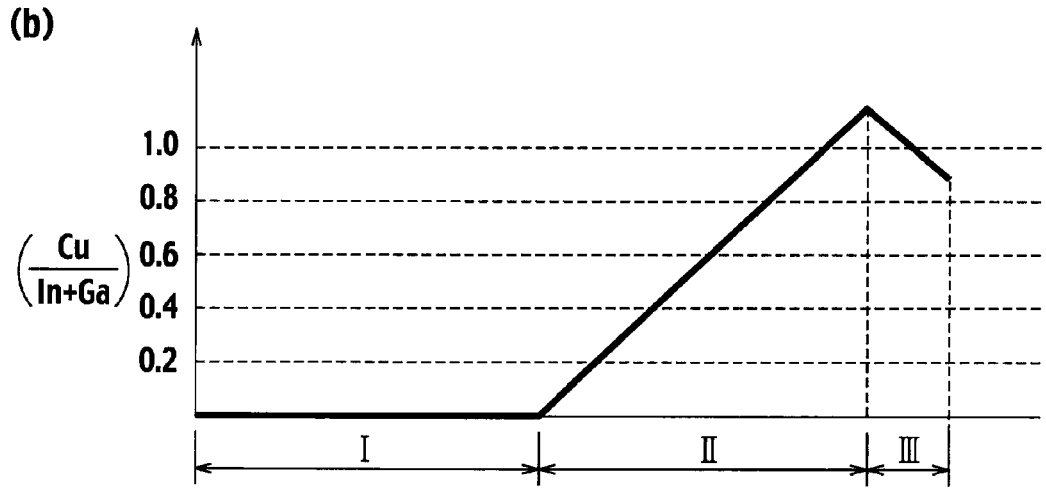

SOLID STATE IMAGING DEVICE AND FABRICATION METHOD FOR THE SAME

TECHNICAL FIELD

The present invention relates to a solid state imaging device and a fabrication method for the same. In particular, the present invention relates to a solid state imaging device provided with a compound semiconductor film of a chalcopyrite structure composed of $Cu(In, Ga)Se_2$ in a photoelectric conversion unit, and a fabrication method for the same.

BACKGROUND ART

The thin film solar cell using $CuInSe_2$ (CIS based thin film) which is the semiconductor thin film of chalcopyrite structure composed of a group Ib element, a group IIIb element, and a group IVb element, or $Cu(In, Ga)Se_2$ (CIGS based thin film) which dissolves Ga to this, for an optical absorption layer, has an advantage that high energy conversion efficiency is indicated and there is little degradation of the efficiency according to light irradiation etc.

However, film formation by 550 degrees C. from a viewpoint of deterioration of film quality and increase of leakage current is general, in formation of the CIS based thin film which is the semiconductor thin film of chalcopyrite structure, or the CIGS based thin film which dissolves Ga to this. When it forms at low temperature rather than 550 degrees C., it has been considered that particle diameter is small composed and dark current characteristics deteriorate, conventionally. In addition, the heat-resistant limitation of an integrated circuit is about 400 degrees C.

On the other hand, a solid state imaging element characterized by forming a switching device by a thin film transistor on a substrate and laminating a sensor area by an amorphous semiconductor layer via a picture element electrode connected to the above-mentioned switching device or a solid state imaging element with which the above-mentioned substrate is formed by an insulating substrate is already disclosed (for example, refer to Patent Literature 1).

In the solid state imaging element disclosed in Patent Literature 1, since the amorphous semiconductor layer is made into a photo sensor area, a photoelectric conversion wavelength is mainly a visible light wavelength region.

Patent Literature 1: Japanese Patent Application Laying-Open Publishing No. 2001-144279

Currently, the CIS based thin film and the CIGS based thin film have the main use as a solar battery.

On the other hand, the inventors of the present invention have paid their attention to a high optical absorption coefficient of this compound semiconductor thin film material and characteristics with the high sensitivity which reaches the wide wavelength region from visible light to near infrared light wavelength region, and have examined using this compound semiconductor thin film material as an image sensor for a security camera (camera which performs sensing of the visible light at daytime and performs sensing of the near infrared light wavelength region at night), a personal authentication camera (camera for performing personal authentication with the near infrared light wavelength region which is not affected by an influence of outdoor daylight) or an in-vehicle camera (camera mounted in a car for visual aid at night, distant visual field securing, etc.).

An object of the present invention is to provide a solid state imaging device, with an easy structure, having the high sensitivity which reaches the wide wavelength region from visible light to near infrared light wavelength region and reducing dark current by providing a photoelectric conversion unit with a compound semiconductor film of the chalcopyrite structure composed of $Cu(In, Ga)Se_2$ in the photoelectric conversion unit.

Moreover, an object of the present invention is to provide a fabrication method of the above-mentioned solid state imaging device.

DISCLOSURE OF INVENTION

A solid state imaging device of the present invention for achieving the above-mentioned object comprises: a circuit unit formed on a substrate; and a photoelectric conversion unit including a lower electrode layer placed on the circuit unit, a compound semiconductor thin film of chalcopyrite structure which is placed on the lower electrode layer and functions as an optical absorption layer, and an optical transparent electrode layer placed on the compound semiconductor thin film, wherein the lower electrode layer, the compound semiconductor thin film, and the optical transparent electrode layer are laminated one after another on the circuit unit.

According to this configuration, the solid state imaging device, with an easy structure, having the optical absorption sensitivity of the compound semiconductor thin film of chalcopyrite structure can be obtained.

In the solid state imaging device of the present invention, the circuit unit includes a transistor by which the lower electrode layer is connected to a gate.

According to this configuration, the solid state imaging device which is provided with the optical absorption sensitivity of the compound semiconductor thin film of chalcopyrite structure, and is provided with the amplifying function by a transistor can be obtained.

In the solid state imaging device of the present invention, the circuit unit includes a transistor by which the lower electrode layer is connected to a source or a drain.

According to this configuration, the solid state imaging device which is provided with the optical absorption sensitivity of the compound semiconductor thin film of chalcopyrite structure and whose optical aperture improved can be obtained.

In the solid state imaging device of the present invention, the circuit unit and the photoelectric conversion cell composed of the photoelectric conversion unit are integrated.

According to this configuration, the solid state imaging devices provided with the optical absorption sensitivity of the compound semiconductor thin film of chalcopyrite structure, such as a line sensor and an area sensor, can be provided.

In the solid state imaging device of the present invention, the circuit unit and the photoelectric conversion cell composed of the photoelectric conversion unit are integrated, and the optical transparent electrode layer is formed on a substrate surface in one piece.

According to this configuration, the solid state imaging device, with an easy structure, in which provides the optical absorption sensitivity of the compound semiconductor thin film of chalcopyrite structure, and which does not need patterning the optical transparent electrode layer can be obtained.

In the solid state imaging device of the present invention, the compound semiconductor thin film of the chalcopyrite structure is $Cu(In_X, Ga_{1-X})Se_2$ (where $0 <= X <= 1$).

According to this configuration, the widening of bandgap energy of the CIS based thin film ($CuInSe_2$) becomes effective by using the CIGS based thin film which displaced a part of In (indium) to gallium. Accordingly, by expanding the bandwidth, the recombination processing of carriers can be reduced and reduction of dark current can be achieved.

In the solid state imaging device of the present invention, the optical transparent electrode layer includes a non-doped ZnO film provided on an interface with the compound semiconductor thin film, and an n type ZnO film provided on the non-doped ZnO film.

According to this configuration, the void and the pinhole which are produced in the CIGS thin film of the underlying are embedded by a semi-insulating layer by providing a non-doped ZnO film (i-ZnO) as the optical transparent electrode layer, and the generation of leakage current can be prevented.

Therefore, the dark current at the pn junction interface can be reduced by forming the non-doped ZnO film (i-ZnO) as a thick film.

The solid state imaging device of the present invention is a photo sensor having sensitivity also in a near infrared optical wavelength region.

Since the solid state imaging device of the present invention has high sensitivity also in a near infrared light wavelength region, the solid state imaging device is available enough as an image sensor for a security camera (camera which performs sensing of the visible light at daytime and performs sensing of the near infrared light wavelength region at night), and personal authentication camera (camera for performing personal authentication with the near infrared light wavelength region which is not affected by an influence of outdoor daylight) or in-vehicle camera (camera mounted in a car for visual aid at night, distant visual field securing, etc.).

The solid state imaging device of the present invention includes a color filter on the optical transparent electrode layer.

According to this configuration, the image sensor for colors can be provided in the visible light wavelength region.

A fabrication method of a solid state imaging device of the present invention in which a circuit unit on a substrate, a lower electrode layer, a compound semiconductor thin film of chalcopyrite structure that functions as an optical absorption layer, and an optical transparent electrode layer are laminated to be composed. The fabrication method comprises: forming the circuit unit on the substrate; forming the lower electrode layer on the substrate on which the circuit unit is formed; patterning the lower electrode layer by photo lithography, and separating for every pixel, forming the compound semiconductor thin film of the chalcopyrite structure all over an element region; and patterning the compound semiconductor thin film of the chalcopyrite structure by photo lithography, and separating for every pixel according to the separated underlying lower electrode layer.

The fabrication method of the solid state imaging device of the present invention further comprises: depositing an interlayer insulating film all over the element region; and patterning the interlayer insulating film by photo lithography, and exposing the compound semiconductor thin film surface of the chalcopyrite structure for every pixel.

The fabrication method of the solid state imaging device of the present invention further comprises forming the optical transparent electrode layer all over the element region.

The fabrication method of the solid state imaging device of the present invention further comprises forming a buffer layer all over the element region after the step of exposing the compound semiconductor thin film surface.

In the fabrication method of the solid state imaging device of the present invention, the step of forming the compound semiconductor thin film of the chalcopyrite structure includes the step of forming $Cu(In_x, Ga_{1-x})Se_2$ (where $0<=X<=1$) thin film by PVD.

The fabrication method of the solid state imaging device of the present invention further comprises forming a color filter on the optical transparent electrode layer.

In the fabrication method of the solid state imaging device of the present invention, the step of forming the optical transparent electrode layer includes: forming a non-doped ZnO film; and forming an optical transparent electrode film, such as an n type ZnO film and an ITO film, on the non-doped ZnO film.

In the fabrication method of the solid state imaging device of the present invention, the step of forming the compound semiconductor thin film of the chalcopyrite structure includes: the first step of patterning by dry etching; and the second step of removing an etching residue produced at the first step by wet etching.

In the fabrication method of the solid state imaging device of the present invention, the first step uses chlorine series gas and bromine series gas as etchant to perform dry etching, and the second step is processed with hydrochloric acid in order to remove a compound of Cu which remains at the first step.

In the fabrication method of the solid state imaging device of the present invention, the compound semiconductor thin film of the chalcopyrite structure is $Cu(In_x, Ga_{1-x})Se_2$ (where $0<=X<=1$).

The fabricated solid state imaging device according to the present invention fabricated by the fabrication method of the solid state imaging device according to the present invention.

BRIEF DESCRIPTION OF THE DRAWINGS

[FIG. 4] A processing diagram of a fabrication method of the solid state imaging device according to the first embodiment of the present invention,
(a) a sputtering process diagram of a lower electrode layer (Mo),
(b) an etching process diagram of a lower electrode layer (Mo)
(c) a formation process diagram of a compound semiconductor thin film (CIGS thin film) of chalcopyrite structure which functions as an optical absorption layer,
(d) an etching process diagram of the compound semiconductor thin film (CIGS thin film),
(e) a deposition process diagram of an interlayer insulating film,
(f) an etching process diagram of the interlayer insulating film,
(g) a solution growth processing diagram of a buffer layer (CdS film), and
(h) a sputtering process diagram of an optical transparent electrode layer (ZnO film).

[FIG. 5] It is a detailed explanation diagram of a formation process of the compound semiconductor thin film of the chalcopyrite structure applied to the solid state imaging device according to the first embodiment of the present invention.

BEST MODE FOR CARRYING OUT THE INVENTION

Figure 1:
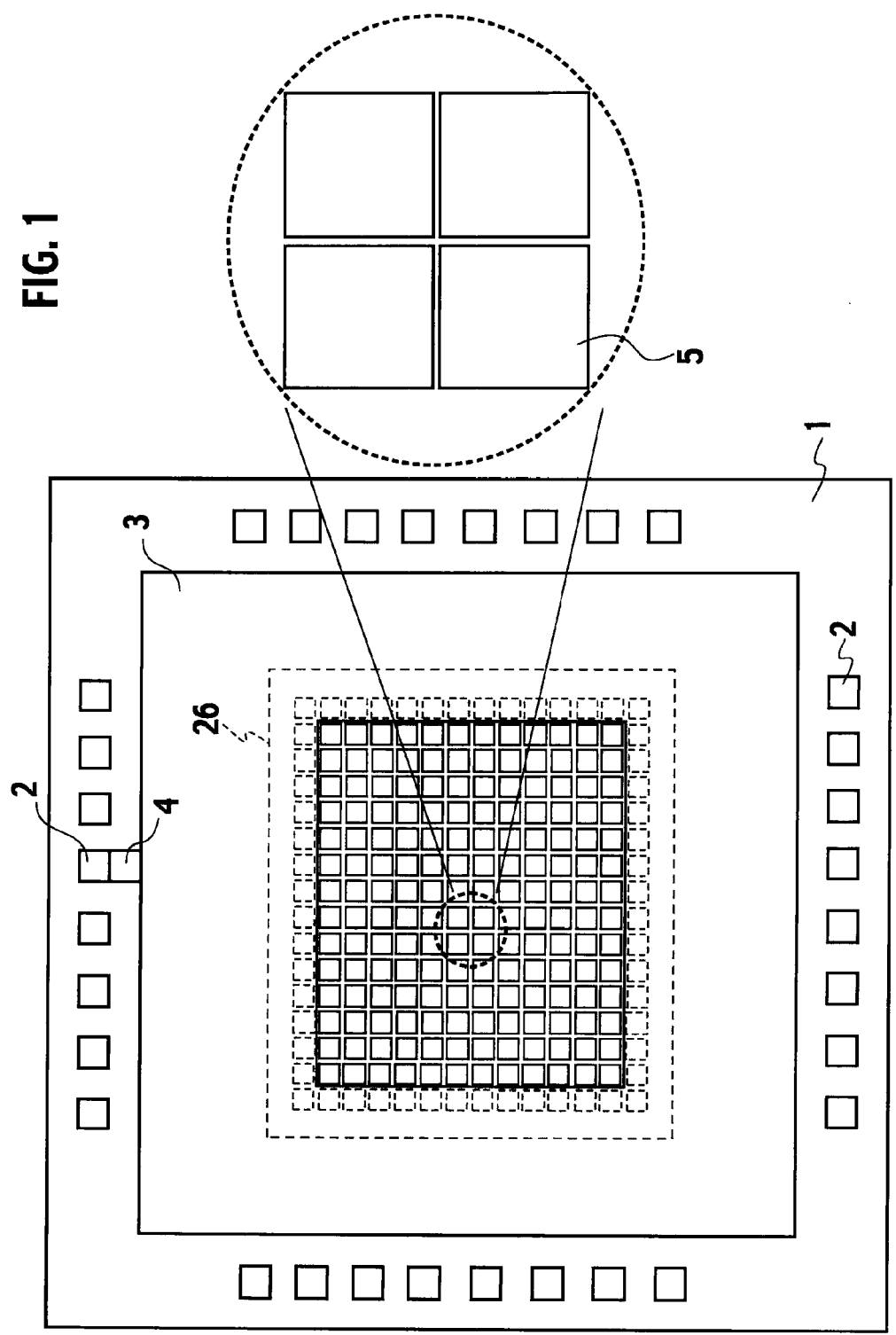
[FIG. 1] It is a whole schematic plane pattern configuration diagram of a solid state imaging device according to a first embodiment of the present invention.

Next, an embodiment of the invention is described with reference to drawings. In the description of the following drawings, the same or similar reference numeral is attached to the same or similar part. However, a drawing is schematic and it should care about differing from an actual thing. Drawings are schematic, not actual, and may be inconsistent in between in scale, ratio, etc.

The embodiment shown in the following exemplifies the device and method for materializing the technical idea of this invention, and this technical idea of the invention does not specify assignment of each component parts, etc. as the following. Various changes can be added to the technical idea of this invention in scope of claims.

[First Embodiment]
(Element Structure)

As shown in FIG. 1, a whole schematic plane pattern configuration of a solid state imaging device according to a first embodiment of the present invention includes: a package substrate 1; a plurality of bonding pads 2 placed at the periphery on the package substrate 1; and an aluminum electrode layer 3 which is connected with the bonding pad 2 via a bonding pad connecting unit 4, and is connected to a transparent electrode layer 26, placed on a pixel 5 of the solid state imaging device, in the periphery of the solid state imaging device. That is, the aluminum electrode layer 3 covers an end region of the transparent electrode layer 26, and the aluminum electrode layer 3 is connected to the one bonding pad 2 via the bonding pad connecting unit 4. Moreover, the pixel 5 is placed at matrix shape in the example of FIG. 1.

Figure 2:
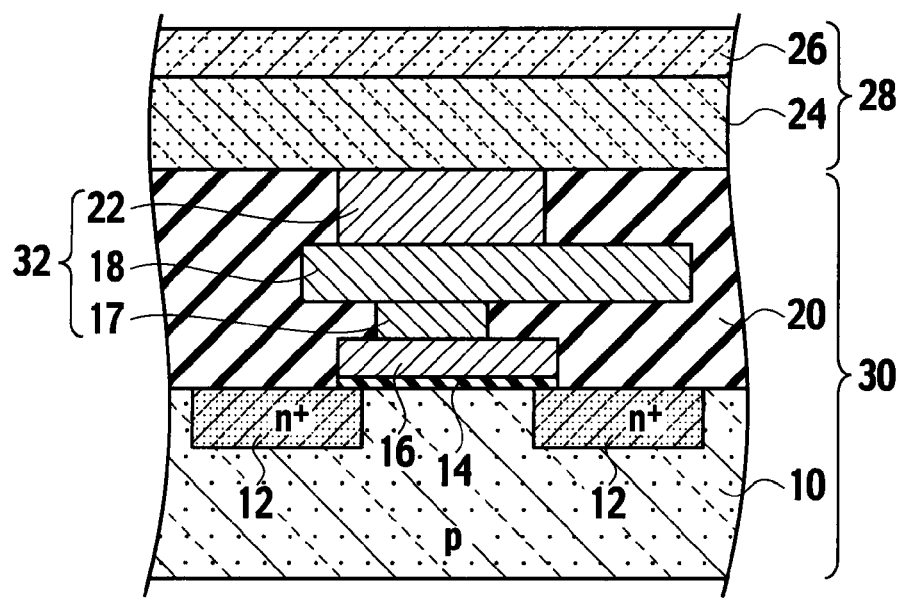
[FIG. 2] It is a schematic cross-sectional configuration diagram of the solid state imaging device according to the first embodiment of the present invention.

As shown in FIG. 2, a schematic cross-section structure of the solid state imaging device according to the first embodiment of the present invention includes a circuit unit 30 formed on a substrate, and a photoelectric conversion unit 28 placed on the circuit unit 30.

The photoelectric conversion unit 28 includes a compound semiconductor thin film ($Cu(In_X, Ga_{1-X})Se_2$ (where $0<=X<=1$)) 24 of chalcopyrite structure which functions as an optical absorption layer, and an optical transparent electrode layer 26 placed on the compound semiconductor thin film 24.

The optical transparent electrode layer 26 is composed of a non-doped ZnO film (i-ZnO) provided on the compound semiconductor thin film 24, and an $n^+$ type ZnO film provided on the non-doped ZnO film (i-ZnO).

The circuit unit 30 is formed by a CMOSFET (Complementary Metal Oxide Semiconductor Field Effect Transistor) integrated circuit etc., for example.

In FIG. 2, an n channel MOS transistor which composes a part of the CMOS is shown in the circuit unit 30, and the circuit unit 30 includes: a semiconductor substrate 10; source/drain regions 12 formed in the semiconductor substrate 10; a gate insulating film 14 placed on the semiconductor substrate 10 between the source/drain regions 12; a gate electrode 16 placed on the gate insulating film 14; a VIA0 electrode 17 placed on the gate electrode 16; a wiring layer 18 for gates placed on the VIA0 electrode 17; and a VIA1 electrode 22 placed on the wiring layer 18.

All of the gate electrode 16, the VIA0 electrode 17, the wiring layer 18, and the VIA1 electrode 22 are formed in an interlayer insulating film 20.

A VIA electrode 32 placed on the gate electrode 16 is formed of the VIA0 electrode 17, the wiring layer 18 placed on the VIA0 electrode 17, and the VIA1 electrode 22 placed on the wiring layer 18. The VIA electrode 32 is shown also in a cross-section structure of FIG. 3 or FIG. 13 described later.

In the solid state imaging device, the gate electrode 16 of the n channel MOS transistor which composes a part of the CMOS and the photoelectric conversion unit 28 are electrically connected via the VIA electrode 32 placed on the gate electrode 16.

Since an anode of a photo diode, which composes the photoelectric conversion unit 28, is connected to the gate electrode 16 of the n channel MOS transistor, optical information detected in the photo diode is amplified by the n channel MOS transistor.

In addition, although the circuit unit 30 is shown by the example of the semiconductor integrated circuit placed on the semiconductor substrate 10 in the example of FIG. 2, the circuit unit 30 can also be formed with a thin film transistor integrated circuit which integrates a thin film transistor formed on a thin film formed on a glass substrate, for example.

Figure 3:
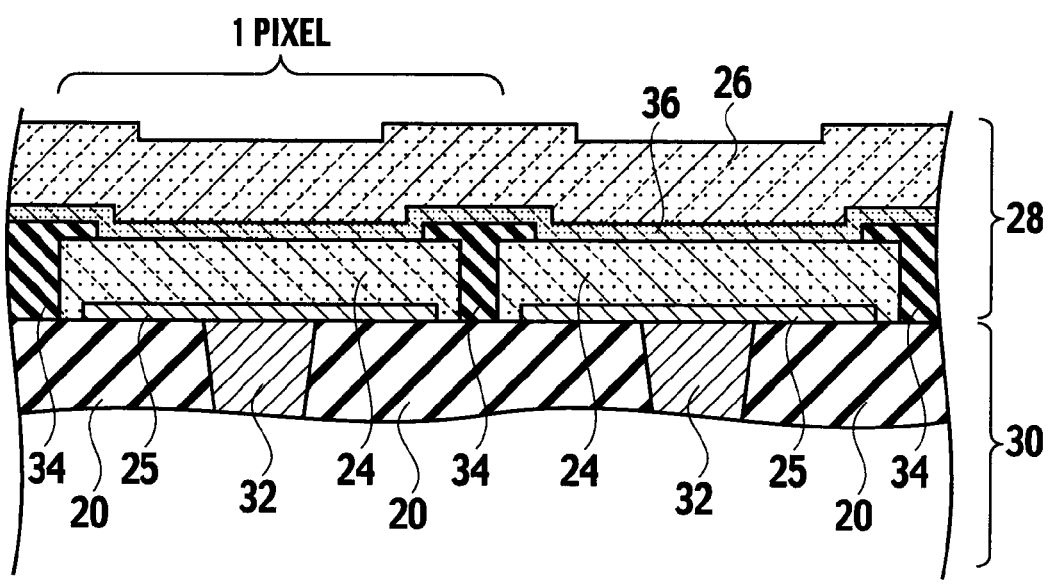
[FIG. 3] It is a schematic cross-sectional configuration diagram including adjoining pixels of the solid state imaging device according to the first embodiment of the present invention

More detailed cross-section structure including the adjoining pixels of the solid state imaging device is expressed as shown in FIG. 3, and the solid state imaging device includes: the circuit unit 30 formed on the semiconductor substrate 10, and the photoelectric conversion unit 28 placed on the circuit unit 30.

The photoelectric conversion unit 28 includes a lower electrode layer 25; the compound semiconductor thin film (Cu(In$_X$, Ga$_{1-X}$)Se$_2$ (where 0<=X<=1)) 24 of chalcopyrite structure which is placed on the lower electrode layer 25 and functions as an optical absorption layer; a buffer layer 36 placed on the compound semiconductor thin film 24; and the optical transparent electrode layer 26 placed on the buffer layer 36.

The lower electrode layer 25 is connected to the gate electrode 16 of the MOS transistor in the circuit unit 30 via the VIA electrode 32.

As clearly from FIG. 3, the compound semiconductor thin film 24 placed on the lower electrode layer 25 and the lower electrode layer 25 is separated each other via the interlayer insulating film 34 between adjoining pixel cells.

Moreover, the buffer layer 36 placed on the compound semiconductor thin film 24 is formed in one piece all over the semiconductor substrate surface.

Moreover, the optical transparent electrode layer 26 is formed in one piece all over a semiconductor substrate surface, and is performed in common electrically.

According to this configuration, the void and the pinhole which are produced in the CIGS thin film of the underlying are embedded by a semi-insulating layer by providing a non-doped ZnO film (i-ZnO) as the optical transparent electrode layer, and the generation of leakage current can be prevented. Therefore, the dark current at the pn junction interface can be reduced by forming the non-doped ZnO film (i-ZnO) as a thick film. In addition, the lower electrode layer 25 and the buffer layer 36 which are shown in FIG. 3 omitted illustrating in FIG. 2.

(Fabrication Method)

A fabrication method of the solid state imaging device according to the first embodiment of the present invention will be explained using a schematic process diagram showing in FIG. 4.

(a) First of all, as shown in FIG. 4(a), a molybdenum (Mo) layer is formed, for example by sputtering technology etc. as the lower electrode layer 25 on the circuit units 30, such as a CMOS integrated circuit formed on the semiconductor substrate. The thickness of the lower electrode layer 25 is about 0.3 μm, for example.

(b) Next, as shown in FIG. 4(b), the lower electrode layer 25 composed of the molybdenum (Mo) layer is patterned, and is separated by etching for every pixel.

(c) Next, as shown in FIG. 4(c), the compound semiconductor thin film (CIGS thin film) 24 of chalcopyrite structure which functions as an optical absorption layer is formed all over the element surface. Three steps of sputtering processes as shown in FIG. 5 described later by the spattering process, for example can be used for the formation process of the compound semiconductor thin film (CIGS thin film) 24. The thickness of the compound semiconductor thin film (CIGS thin film) 24 is about 1.0 μm, for example.

(d) Next, as shown in FIG. 4(d), the compound semiconductor thin film (CIGS thin film (p$^-$)) 24 is patterned by two-step etching using the dry etching and the wet etching together. Accordingly, the compound semiconductor thin film (CIGS thin film (p$^-$)) 24 separated electrically is obtained.

In detail, when performing dry etching of the compound semiconductor thin film (CIGS thin film (p$^-$)) 24 using a resist pattern, it patterns by etching vertically the compound semiconductor thin film (CIGS thin film (p$^-$)) 24 using chlorine series gas and bromine series gas as etchant. In this case, although the etching which does not almost have side etching is possible at a high rate, a plurality of pillar-shaped residues remain on a plurality of Mo films. The residues are removed completely by processing with hydrochloric acid. In the above-mentioned dry etching process, Cu(Br)$_x$ is generated by reactive gas, and Cu(Br)$_x$ is removed by the wet etching processes by hydrochloric acid treatment.

Thus, the compound semiconductor thin film (CIGS thin film (p$^-$)) 24 which composes an optical absorption layer can be etched with high precision at a high rate, without producing undercutting region, by using chlorine series gas and bromine series gas as etchant of dry etching. Then, the pillar-shaped residues are completely removed by performing short-time wet etching. Accordingly, it is possible of patterning of a highly precise CIGS film, without producing the residues. In this case, neither damage nor a defect is produced in the crystal of the CIGS thin film 24, but it is possible of the substantial reduction of the dark current. Next, the resist pattern is removed. A device cross section of this state is shown in FIG. 4(d). In addition, in FIG. 4(d), in order that it is easy, the width of the compound semiconductor thin film 24 after etching and the width of the lower electrode layer 25 are illustrated equally. However, in more details, as shown in FIG. 3, it may set up so that the width of the compound semiconductor thin film 24 after etching may be wider than the width of the lower electrode layer 25.

(e) Next, as shown in FIG. 4(e), the interlayer insulating film 34 is deposited all over the element surface. As the interlayer insulating film 34, an insulating film, such as a TEOS (tetra-ethoxy silane) film, a BPSG film, a CVD oxide film, and a CVD nitride film, or these multilayer films can be used, for example (f) Next, as shown in FIG. 4(f), the interlayer insulating film 34 is patterned and the surface of the compound semiconductor thin film (CIGS thin film (p$^-$)) 24 is exposed by etching. The width of the exposed region is narrower than the width of the compound semiconductor thin film 24.

(g) Next, as shown in FIG. 4(g), the thin CdS film (about 50 nm) as the buffer layer (window layer) 36 is formed by a solution growth method. The buffer layer 36 can be formed with sufficient coating film characteristics by the solution growth method.

(h) Next, as shown in FIG. 4(h), the optical transparent electrode layer (ZnO film) 26 is formed by a spattering process. At this time, the buffer layer 36 reduces the damage to the compound semiconductor thin film 24.

The optical transparent electrode layer (ZnO film) 26 is formed by forming continuously the non-doped ZnO film (i-ZnO) and the ZnO (n$^+$) film of the low resistivity by which the n type impurity is doped. In this case, the thickness of i-ZnO is about 60 nm, and, on the other hand, the thickness of the ZnO (n$^+$) film of low resistivity is about 0.5 μm.

A non-doped ZnO film (i-ZnO) embeds the void and the pinhole, which are produced in the CIGS thin film 24 of the underlying, by the semi-insulating layer, and plays the role which prevents the generation of leakage current.

Therefore, the dark current of the pn junction interface can be reduced by forming the non-doped ZnO film (i-ZnO) as a thick film. However, although the thick film is formed, since this thickness is thin enough (for example, about 60 nm), it is considered that pn junction is formed substantially between the ZnO (n⁺) film of low resistivity, which functions as the optical transparent electrode layer 26, and the CIGS thin film (p⁻).

(i) Finally, the process of electrode formation is performed. Since it is the same as that of the electrode formation process in the usual CMOS process, the explanation is omitted. In addition, since the optical transparent electrode layer (ZnO film) 26 becomes equi-potential, it is not necessary to perform isolation formation of the optical transparent electrode layer (ZnO film) 26 for every pixel. However, the electrode composed of aluminum etc. may be placed to be meshed shaped or stripe shaped on the optical transparent electrode layer (ZnO film) 26 in a fixed pitch, in the range which does not have on the optical aperture of a pixel, in the case of the large capacity area sensor etc. with which specific resistivity becomes a problem.

(j) Furthermore, in a visible light wavelength region, when imaging a color picture, a color filter may be placed on the optical transparent electrode layer (ZnO film) 26. The color filters may be provided of a filter for red, a filter for green, and a filter for blue in the adjacent pixel 5, and is effective also as one at 3 couples. It is effective also as one at 4 couples by adding the filter for near-infrared rays. These 4 couples may be placed to the matrix shape of 2×2. The color filter can also be formed by multi-layering of a gelatin film, for example.

(Formation Process of Compound Semiconductor Thin Film of Chalcopyrite Structure)

The compound semiconductor thin film of chalcopyrite structure which functions as the optical absorption layer can be formed on the semiconductor substrate or a glass substrate in which the circuit unit 30 is formed by the vacuum evaporation method called the PVD (Physical Vapor Deposition) method or the sputtering method. In this case, the PVD shall mean the method of forming a film by making the primary material evaporated in the vacuum deposit.

When using the vacuum evaporation method, it is made to vapor-deposit independently on the substrate, in which the circuit unit 30 is formed, by making each component (Cu, In, Ga, Se) of the compound as a vacuum evaporation source.

In the sputtering method, a chalcopyrite compound is used as a target or each of the components is independently used as a target.

In addition, since the substrate is heated to high temperature when forming the compound semiconductor thin film of chalcopyrite structure on the glass substrate in which the circuit unit 30 is formed, the stoichiometry shift may occur by separation of a chalcogenide element. In this case, it is preferable by performing heat treatment for about one to several hours at the temperature of 400 to 600 degrees C. in the vapor phase atmosphere of Se or S after film formation in order to compensate Se or S (a selenium processing or a sulfuric processing).

A formation process of the compound semiconductor thin film of the chalcopyrite structure applied to the solid state imaging device according to the first embodiment of the present invention is expressed, for example, as shown in FIG. 5.

When forming the CIGS thin film (Cu(In$_X$, Ga$_{1-X}$)Se$_2$ (where 0<=X<=1)) of p⁻ type with which composition control is achieved, using the ion beam sputtering method, it is performed by dividing into three steps, a stage I, a stage II, and a stage III, for example, as shown in FIG. 5. FIG. 5(*a*) shows ion species at the time of forming the film by the ion beam sputtering method, and the substrate temperature in each stage. FIG. 5(*b*) shows the composition ratio in each stage (Cu/(In+Ga)). The rate of In and Ga is suitably adjusted so that it may describe later. The substrate temperature is about 400 degrees C. also the highest, for example.

First of all, in the stage I, the composition ratio of (Cu/(In+Ga)) is remained 0, in a state where the group III element is a rich state.

Next, when shifting to the stage II, it shifts to the rich state of Cu element of (Cu/(In+Ga)) whose composition ratio is 0 to not less than 1.0.

Next, when shifting to the stage III, it shifts to the rich state of the group III element whose composition ratio is not more than 1.0 from the rich state of Cu element whose composition ratio is not less than 1.0 of (Cu/(In+Ga)). Then, the compound semiconductor thin film (Cu(In$_X$, Ga$_{1-X}$)Se$_2$ (where 0<=X<=1)) of desired chalcopyrite structure is formed. As mentioned above, in this embodiment, the formation of the compound semiconductor thin film 24 is performed in not more than about 400 degrees C. When the substrate temperature is high enough, each constituent element may be diffused mutually.

Figure 6:
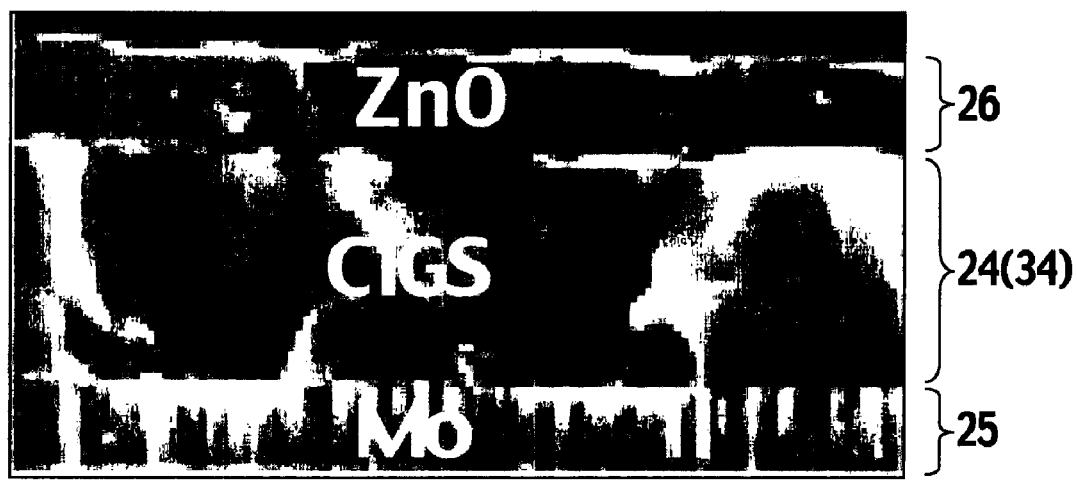
[FIG. 6] It is an SEM photographic diagram of a cross-section structure of a photoelectric conversion unit formed by the fabrication method of the solid state imaging device according to the first embodiment of the present invention.

FIG. 6 shows an SEM photograph (about 10,000 times) of a cross-section structure of the photoelectric conversion unit formed by the fabrication method of the solid state imaging device according to the first embodiment of the present invention. The lower electrode layer 25 composed of Mo, the CIGS thin film 24 formed by patterning on the lower electrode layer 25, and the optical transparent electrode layer (ZnO film) 26 formed on the CIGS thin film 24 on the whole surface, are formed. In addition, although the buffer layer (CdS film) 36 intervenes between the CIGS thin film 24 and the optical transparent electrode layer (ZnO film) 26 and is formed on the CIGS thin film 24 on the whole surface, since the buffer layer (CdS film) 36 is very thin compared with other layers, it is not illustrated in FIG. 6. Moreover, although the interlayer insulating film 34 exists in the same level as the CIGS thin film 24, it is not illustrated in FIG. 6.

(Energy Band Structure)

Figure 7:
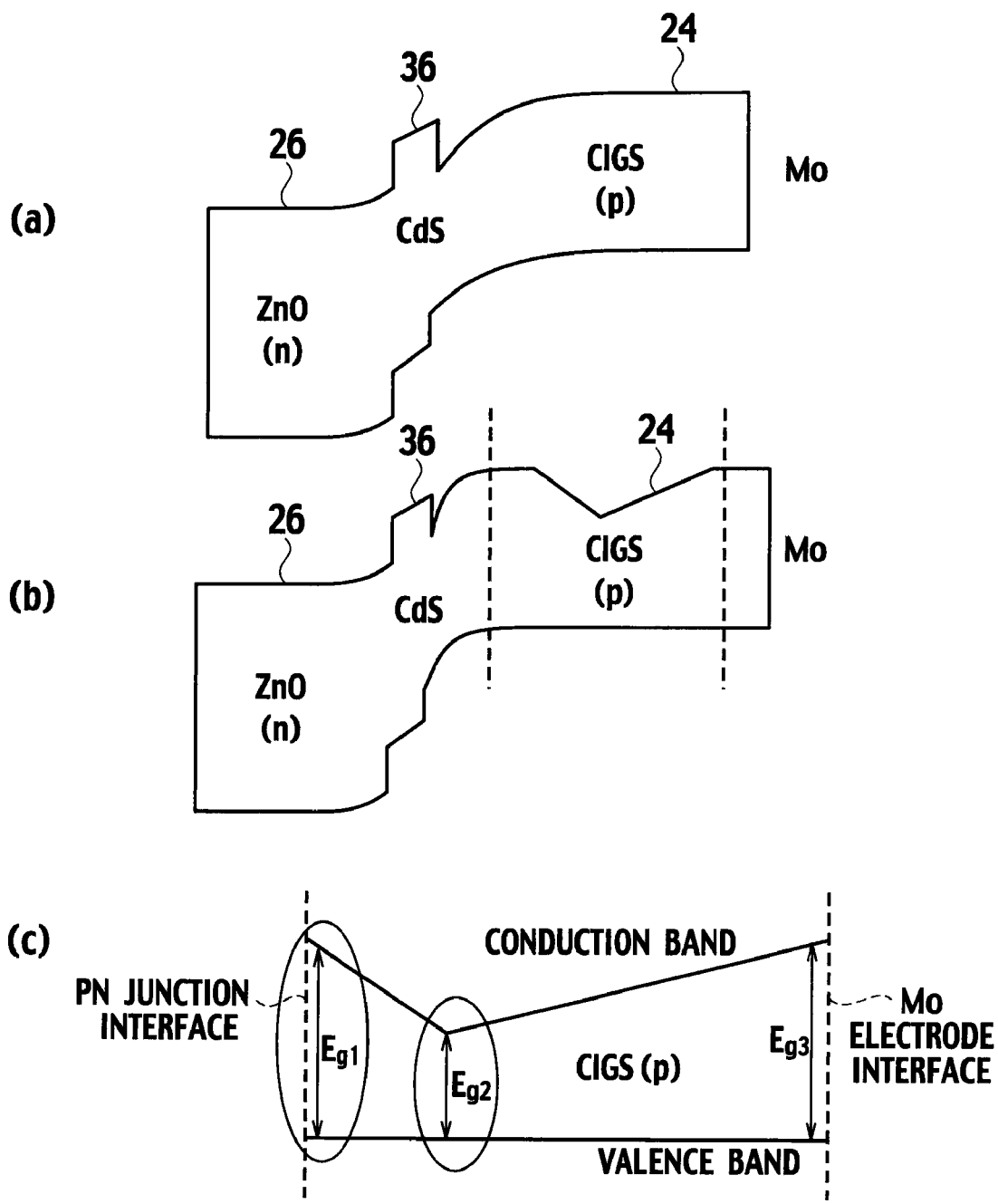
[FIG. 7] A schematic diagram of an energy band structure in the photoelectric conversion unit of the solid state imaging device according to the first embodiment of the present invention,
(a) a schematic diagram of energy band structure at the time where the composition of the CIGS thin film is formed uniform,
(b) a schematic diagram of the energy band structure at the time of performing bandgap control, and
(c) a detailed enlarged drawing of the energy band structure of CIGS (p) thin film 24 part at the time of performing bandgap control.

An energy band structure in the photoelectric conversion unit of the solid state imaging device is expressed as schematically shown in FIG. 7.

That is, FIG. 7(*a*) shows the energy band structure of the pn junction diode of the photoelectric conversion unit composed of ZnO (n)/CdS/CIGS (p) in a thermal equilibrium state when the composition of the CIGS thin film is formed uniform, and FIG. 7(*b*) shows the energy band structure of the pn junction diode of the photoelectric conversion unit composed of ZnO (n)/CdS/CIGS (p) in the thermal equilibrium state at the time of controlling the composition of the CIGS thin film and performing bandgap control. FIG. 7(*c*) shows a detailed enlarged drawing of the energy band structure of CIGS (p) thin film 24 part at the time of performing bandgap control of FIG. 7(*b*)

If the bandgap is large, the leakage current will be reduced and the dark current will decrease. On the other hand, if the bandgap is small, the photoelectric conversion efficiency will increase.

In the solid state imaging device, the composition control of the CIGS thin film in the photoelectric conversion unit is performed, the bandgap profile is controlled, and thereby the reduction of dark current and the improvement in the photoelectric conversion characteristic in a predetermined wavelength region can be achieved.

For example, as shown in FIG. 7(*c*), in order to reduce dark current, the composition of the compound semiconductor thin film (Cu(In$_x$, Ga$_{1-x}$)Se$_2$ (where 0<=X<=1)) 24 is made into Ga rich, and the energy gaps $E_{g1}$ and $E_{g3}$ are enlarged so as to be illustrated, near the Mo electrode interface and near the pn junction interface.

On the other hand, in order to improve the photoelectric conversion efficiency in the near-infrared wavelength band region up to about 1300 nm, the composition of the compound semiconductor thin film ($Cu(In_X, Ga_{1-X})Se_2$ (where 0<=X<=1)) 24 is made into In rich in the range of the predetermined depth, and the energy gap $E_{g2}$ is made small so as to be illustrated.

In addition, in the operation of the solid state imaging device, reverse bias voltage is applied, for example, between the p type CIGS thin film 24 and the n type optical transparent electrode layer (ZnO film) 26, and pixel information is detected.

Figure 8:
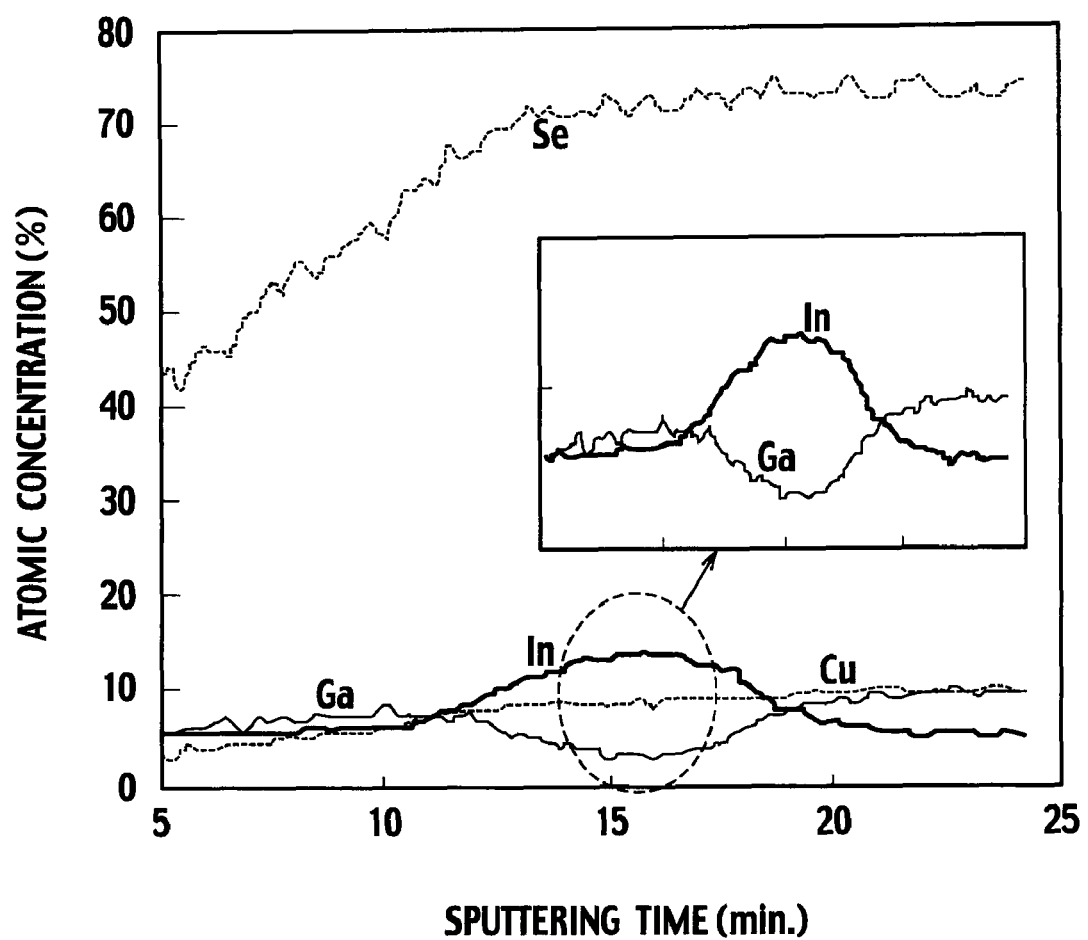
[FIG. 8] It is an example of an analysis result by AES (Auger Electron Spectroscopy) of the compound semiconductor thin film (CIGS thin film) of the photoelectric conversion unit formed by the fabrication method of the solid state imaging device according to the first embodiment of the present invention, and is a relationship diagram of atomic concentration (%) and a sputtering time.

FIG. 8 shows an example of an analysis result by AES (Auger Electron Spectroscopy) of the compound semiconductor thin film (CIGS thin film) of the photoelectric conversion unit formed by the fabrication method of the solid state imaging device, and shows the relation between the atomic concentration (%) and the sputtering time.

The In rich region is formed in the predetermined depth in the compound semiconductor thin film (CIGS thin film) of the photoelectric conversion unit.

(Bandgap Energy and In/(In+Ga) Composition Ratio Characteristics)

Figure 9:
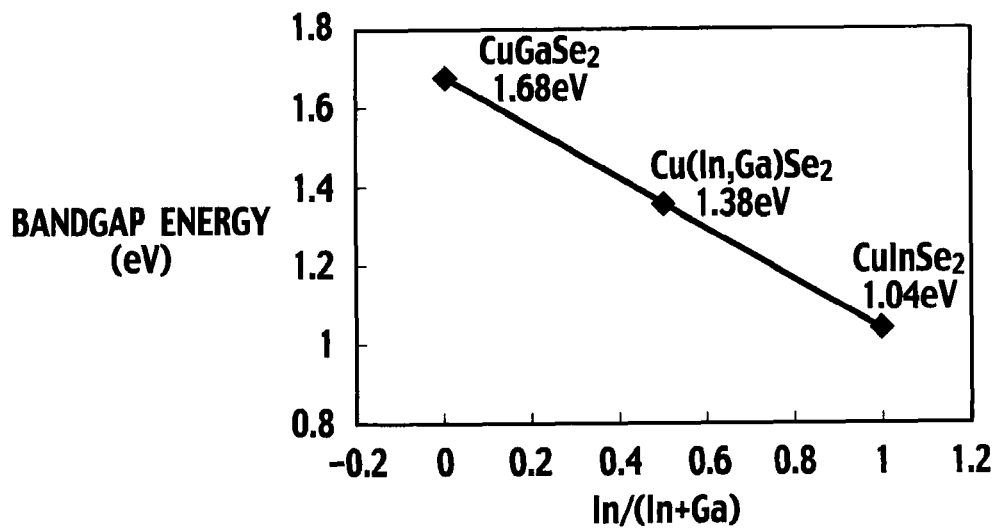
[FIG. 9] It is a dependence characteristics diagram of the bandgap energy of the compound semiconductor thin film of chalcopyrite structure and In/(In+Ga) composition ratio which are applied to the solid state imaging device according to the first embodiment of the present invention.

The dependence of the bandgap energy of the compound semiconductor thin film ($Cu(In_X, Ga_{1-X})Se_2$ (where 0<=X<=1)) of chalcopyrite structure applied to the solid state imaging device and In/(In+Ga) composition ratio is expressed as shown in FIG. 9.

As shown in FIG. 9, the bandgap energy of $Cu(Ga)Se_2$ is 1.68 ev, the bandgap energy of $Cu(In, Ga)Se_2$ is 1.38 ev, and the bandgap energy of $Cu(In)Se_2$ is 1.04 ev.

Since the bandgap energy of the compound semiconductor thin film ($Cu(In_X, Ga_{1-X})Se_2$ (where 0<=X<=1)) of chalcopyrite structure can be made variable by controlling In/(In+Ga) composition ratio, as shown in FIG. 9, the photoelectric conversion wavelength can be made variable by the composition control.

(Photoelectric Conversion Characteristic)

Figure 10:
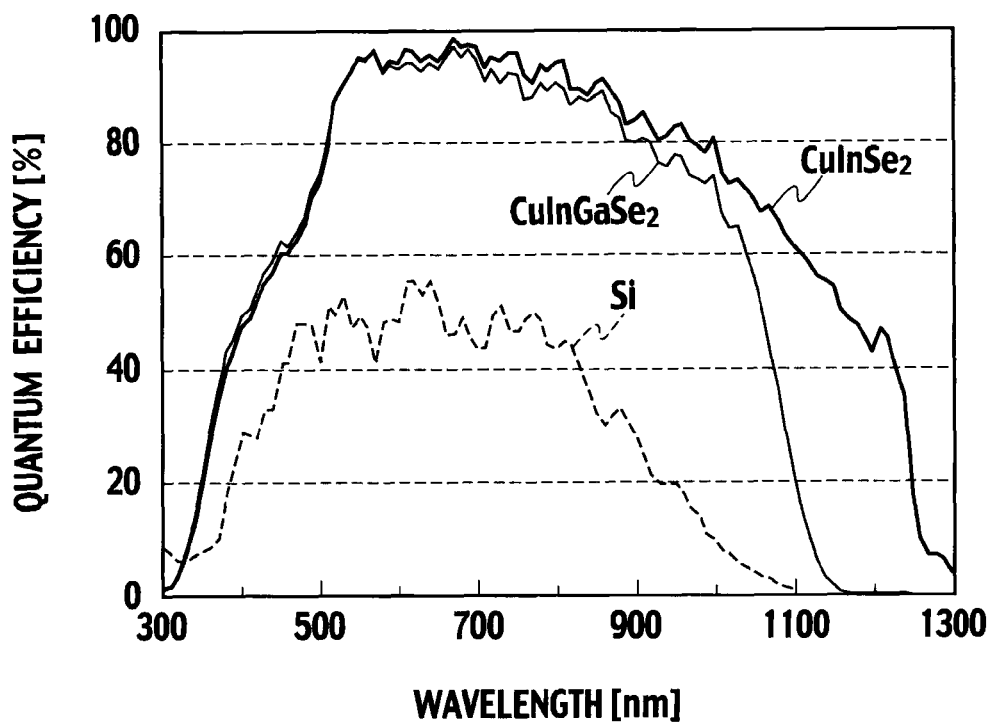
[FIG. 10] It is a wavelength characteristic of quantum efficiency for explaining the photoelectric conversion characteristic of the solid state imaging device according to the first embodiment of the present invention.

The photoelectric conversion characteristic of the solid state imaging device is expressed as shown in FIG. 10. That is, in the wide wavelength region from the visible light wavelength region to the near infrared light wavelength region, the photoelectric conversion characteristic of high quantum efficiency is shown reflecting the quantum efficiency of the compound semiconductor thin film ($Cu(In_X, Ga_{1-X})Se_2$ (where 0<=X<=1)) 24 of chalcopyrite structure which functions as the optical absorption layer. Compared with the photoelectric conversion characteristic in the case of silicon (Si), the value of the quantum efficiency becomes two or more times.

The wavelength region is extensible to about 1300 nm which is a wavelength of the near infrared light wavelength region by changing the composition of the compound semiconductor thin film ($Cu(In_X, Ga_{1-X})Se_2$ (where 0<=X<=1)) 24 of chalcopyrite structure which functions as the optical absorption layer from $Cu(InGa)Se_2$ to $Cu(In)Se_2$.

Figure 11:
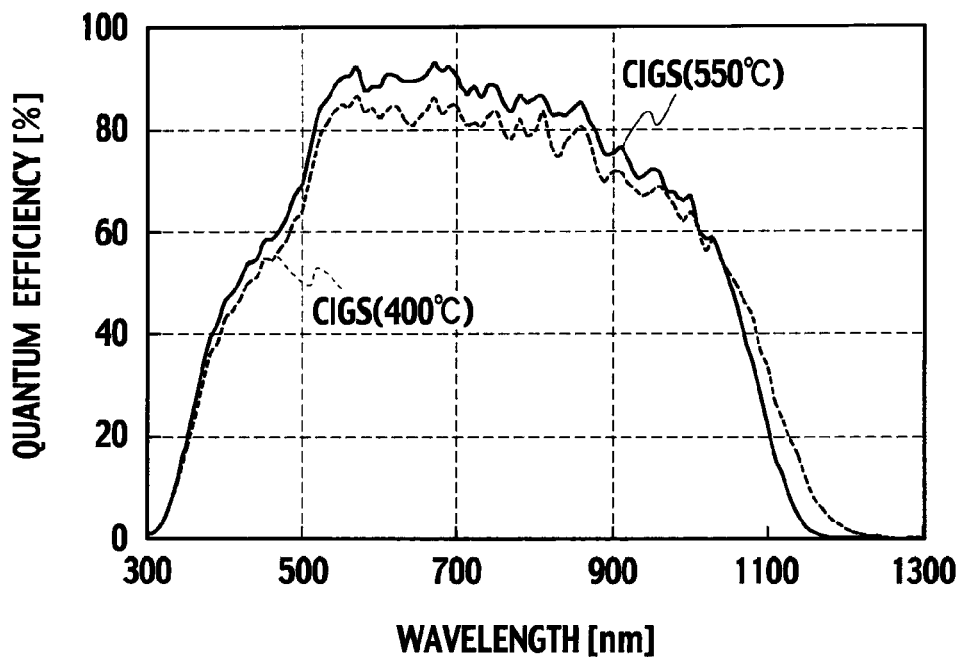
[FIG. 11] It is a wavelength characteristic of the quantum efficiency of the compound semiconductor thin film (CIGS thin film) formed by the fabrication method of the solid state imaging device according to the first embodiment of the present invention.

FIG. 11 shows the wavelength characteristic of the quantum efficiency of the compound semiconductor thin film (CIGS thin film) formed by the fabrication method of the solid state imaging device.

In the fabrication method of the solid state imaging device, the dark current density of the same grade as the CIGS thin film formed at 550 degrees C. is obtained by combining the composition control of the compound semiconductor thin film ($Cu(In_X, Ga_{1-X})Se_2$ (where 0<=X<=1)) 24, in a low temperature processing of 400 degrees C.

In the formation of the compound semiconductor thin film ($Cu(In_X, Ga_{1-X})Se_2$ (where 0<=X<=1)), since the film formation by 550 degrees C. is general from a viewpoint of film quality and leakage current, it was difficult to form semiconductor integrated circuits, such as CMOS, in a circuit unit. In contrast to it, in the solid state imaging device, low temperature processing by about 400 degrees C. becomes possible, and the dark current is also suppressed, by formation of the compound semiconductor thin film (CIGS thin film) by composition control.

Moreover, also in the wavelength characteristic of the quantum efficiency of the compound semiconductor thin film (CIGS thin film) formed by the fabrication method of the solid state imaging device, the wavelength characteristic of the same grade as the CIGS thin film formed by 550 degrees C. is obtained, in the low temperature processing by about 400 degrees C., by formation of the compound semiconductor thin film (CIGS thin film) by the composition control.

Figure 12:
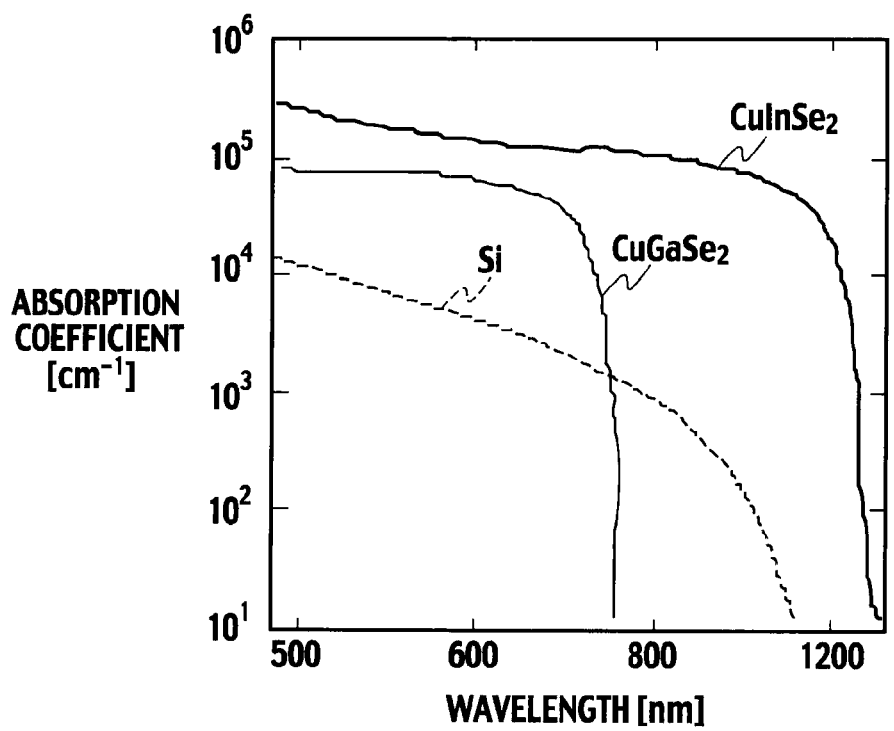
[FIG. 12] It is an optical absorption characteristics diagram of the solid state imaging device according to the first embodiment of the present invention.

According to the optical absorption characteristics shown in FIG. 12, the penetration depth of the light which light intensity decreases to (1/e) can be obtained from the reciprocal of the absorption coefficient. Moreover, the energy gap of the corresponding compound semiconductor thin film ($Cu(In_X, Ga_{1-X})Se_2$ (where 0<=X<=1)) 24 can be obtained according to FIG. 9.

(Optical Absorption Characteristics)

The optical absorption characteristics of the solid state imaging device are expressed as shown in FIG. 12. That is, it has strong absorption performance reflecting the optical absorption coefficient characteristics of the compound semiconductor thin film ($Cu(In_X, Ga_{1-X})Se_2$ (where 0<=X<=1)) 24 of chalcopyrite structure which functions as the optical absorption layer, in the wide wavelength region from visible light to a near infrared light wavelength region.

For example, it is about 100 times the absorption coefficient of silicon (Si) also in the visible light wavelength region, and the absorption performance is extensible to the wavelength of about 1300 nm by changing the composition of the compound semiconductor thin film ($Cu(In_X, Ga_{1-X})Se_2$ (where 0<=X<=1)) 24 of chalcopyrite structure which functions as the optical absorption layer from $CuGaSe_2$ to $CuInSe_2$.

(Modified Example of First Embodiment)

Figure 13:
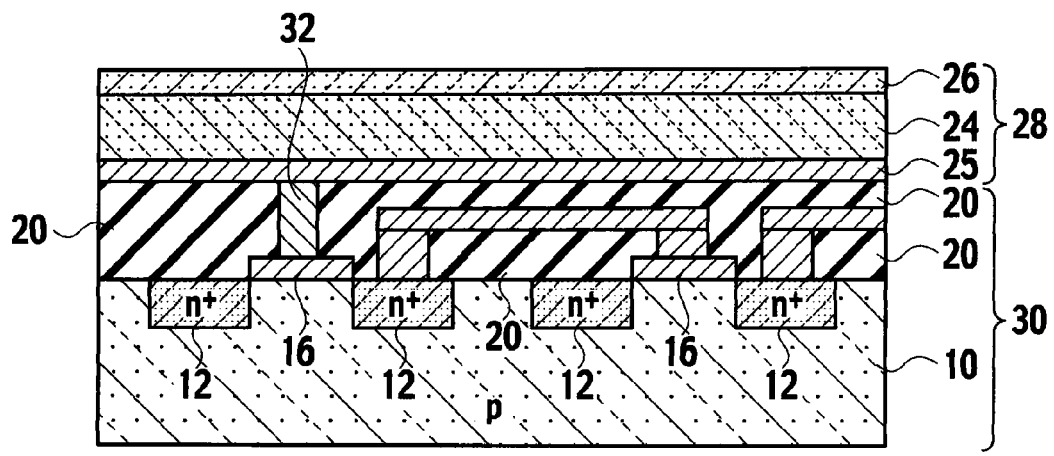
[FIG. 13] It is a schematic cross-sectional configuration diagram of one pixel part of the solid state imaging device according to a modified example of the first embodiment of the present invention.

As shown in FIG. 13 as a cross-sectional view of one pixel part, a solid state imaging device according to a modified example of the first embodiment of the present invention includes: a circuit unit 30 formed on the semiconductor substrate 10; and a photoelectric conversion unit 28 including a lower electrode layer 25 placed on the circuit unit 30, a compound semiconductor thin film ($Cu(In_X, Ga_{1-X})Se_2$ (where 0<=X<=1)) 24 of chalcopyrite structure which is placed on the lower electrode layer 25 and functions as an optical absorption layer, and an optical transparent electrode layer 26 placed on the compound semiconductor thin film 24.

The lower electrode layer 25, the compound semiconductor thin film 24, and the optical transparent electrode layer 26 are laminated one after another on the circuit unit 30.

Moreover, the circuit unit 30 includes a transistor by which the lower electrode layer 25 is connected to a gate electrode 16, in the solid state imaging device.

As the lower electrode layer 25, molybdenum (Mo), niobium (Nb), tantalum (Ta), tungsten (W), etc. can be used, for example.

The optical transparent electrode layer 26 is composed of a non-doped ZnO film (i-ZnO) provided in an interface with the compound semiconductor thin film 24, and an n+ type ZnO film provided on the non-doped ZnO film G-ZnO.

According to this configuration, the void and pinhole which are produced in the CIGS thin film of the underlying are embedded by a semi-insulating layer by providing a non-doped ZnO film (i-ZnO) as the optical transparent electrode layer, and the CIGS thin film and i-p junction is formed, and the generation of leakage current by the tunnel current which occurs when a conductive ZnO film (n+) is contacted the CIGS thin film directly can be prevented. Therefore, the dark current at the pn junction interface can be reduced by forming the non-doped ZnO film (i-ZnO) as a thick film.

Moreover, as the optical transparent electrode layer 26, other electrode materials are also applicable. For example, an ITO film, a tin oxide ($SnO_2$) film, or an indium oxide ($In_2O_3$) film can be used.

In FIG. 13, the circuit unit 30 is formed with a CMOS integrated circuit, for example. In FIG. 13, a gate insulating film placed on a semiconductor substrate 10 between source/drain regions 12 is omitting illustration. Moreover, a VIA electrode 32 embedded in an interlayer insulating film 20 is placed between a gate electrode 16 and the lower electrode layer 25.

Moreover, as for the solid state imaging device according to the modified example of the first embodiment of the present invention, a photoelectric conversion cell composed of the circuit unit 30 and the photoelectric conversion unit 28 is integrated by one-dimensional matrix shape or two-dimensional matrix shape.

Moreover, in a plurality of integrated pixels, the optical transparent electrode layer 26 is formed on the semiconductor substrate surface in one piece, and is performed in common electrically.

That is, in the solid state imaging device according to the first embodiment of the present invention, the optical transparent electrode layer 26 becomes a cathode electrode of the photo diode (PD) which composes the photoelectric conversion unit 28, and is achieved by constant potential (for example, power supply voltage). Therefore, in a plurality of integrated pixels, it is not necessary to perform isolation formation of the cathode electrode of the photo diode (PD) which composes the photoelectric conversion unit 28, and it is formed on the semiconductor substrate surface in one piece, and is performed in common electrically.

According to the solid state imaging device according to the modified example of the 1st embodiment of the present invention, whole pixel region of the photoelectric conversion cell is usable as the substantial photoelectric conversion region by the laminated structure of the circuit unit 30 and the photoelectric conversion unit 28. Accordingly, in the CMOS type image sensor, the optical aperture is about 80 to about 90% compared with about 30 to about 40% of the optical aperture at the time of forming in the semiconductor substrate by applying the photoelectric conversion unit 28 as a pn junction diode, and it has a large improvement effect.

According to the solid state imaging device according to the first embodiment and its modified example of the present invention, the solid state imaging device, with an easy structure, having the high sensitivity which reaches the wide wavelength region from visible light to near infrared light wavelength region and reducing dark current can be provided by providing the compound semiconductor film of the chalcopyrite structure composed of Cu(In, Ga)$Se_2$ in the photoelectric conversion unit.

Moreover, according to the fabrication method of the solid state imaging device according to the first embodiment and its modified example of the present invention, since the optical transparent electrode layer can form on the substrate surface in one piece and it does not need to pattern the optical transparent electrode layer, the fabricating process can be simplified.

Moreover, according to the solid state imaging device according to the first embodiment and its modified example of the present invention, the carrier recombination processing can be reduced and the dark current can be reduced by expanding the bandwidth using the CIGS based thin film which replaced a part of In (indium) by gallium.

Moreover, according to the solid state imaging device according to the first embodiment and its modified example of the present invention, the dark current density can be reduced by the order of $10^2$ by the bandgap control by Cu($In_X$, $Ga_{1-X}$)$Se_2$ (where $0<=X<=1$).

[Second Embodiment]
(Element Structure)

Figure 14:
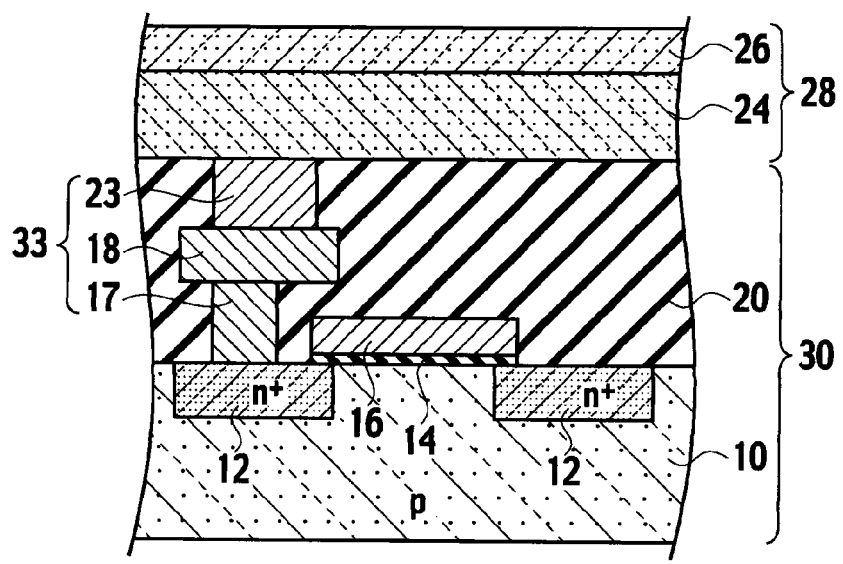
[FIG. 14] It is a schematic cross-sectional configuration diagram of a solid state imaging device according to a second embodiment of the present invention.

A solid state imaging device according to a second embodiment of the present invention includes a circuit unit 30 formed on a substrate, and a photoelectric conversion unit 28 placed on the circuit unit 30, as shown in FIG. 14.

The photoelectric conversion unit 28 includes a compound semiconductor thin film (Cu($In_X$, $Ga_{1-X}$)$Se_2$ (where $0<=X<=1$)) 24 of chalcopyrite structure which functions as an optical absorption layer, and an optical transparent electrode layer 26 placed on the compound semiconductor thin film 24.

The optical transparent electrode layer 26 is composed of a non-doped ZnO film (i-ZnO) provided on an interface with the compound semiconductor thin film 24, and an n+ type ZnO film provided on the non-doped ZnO film (i-ZnO).

According to this configuration, the void and pinhole which are produced in the CIGS thin film of the underlying are embedded by a semi-insulating layer by providing a non-doped ZnO film (i-ZnO) as the optical transparent electrode layer, and the CIGS thin film and i-p junction is formed, and the generation of leakage current by the tunnel current which occurs when a conductive ZnO film (n+) is contacted the CIGS thin film directly can be prevented. Therefore, the dark current at the pn junction interface can be reduced by forming the non-doped ZnO film (i-ZnO) as a thick film.

The circuit unit 30 is formed with a CMOS (Complementary Metal oxide Semiconductor Field Effect Transistor) integrated circuit etc., for example. In FIG. 14, an n channel MOS transistor which composes a part of CMOS is shown in the circuit unit 30, and the circuit unit 30 includes: a semiconductor substrate 10; source/drain regions 12 formed in the semiconductor substrate 10; a gate insulating film 14 placed on the semiconductor substrate 10 between the source/drain regions 12; a gate electrode 16 placed on the gate insulating film 14; a VIA0 electrode 17 placed on the source/drain region 12, a wiring layer 18 for source/drain placed on the VIA0 electrode 17, and a VIA1 electrode 23 placed on the wiring layer 18. All of the VIA0 electrode 17, the wiring layer 18, and the VIA1 electrode 23 are formed in an interlayer insulating film 20.

A VIA electrode 33 placed on the source/drain region 12 is placed and formed of the VIA0 electrode 17, the wiring layer 18 placed on the VIA0 electrode 17, and the VIA1 electrode 23 placed on the wiring layer 18. The VIA electrode 33 is shown also in the cross-section structure of FIG. 15 described later.

In the solid state imaging device according to the second embodiment of the present invention, the source/drain region 12 of the n channel MOS transistor which compose a part of the CMOS and the photoelectric conversion unit 28 are electrically connected via the VIA electrode 33 placed on the source/drain region 12.

Since the anode of the photo diode, which composes the photoelectric conversion unit 28, is connected to the source/drain region 12 of the n channel MOS transistor, the optical information detected in the photo diode is switched by the n channel MOS transistor.

In addition, although the circuit unit 30 is shown by the example of the semiconductor integrated circuit placed on the semiconductor substrate 10 in the example of FIG. 14, the circuit unit 30 can also be formed with the thin film transistor integrated circuit which integrates the thin film transistor formed on the thin film formed on the glass substrate, for example.

(Modified Example of Second Embodiment)

Figure 15:
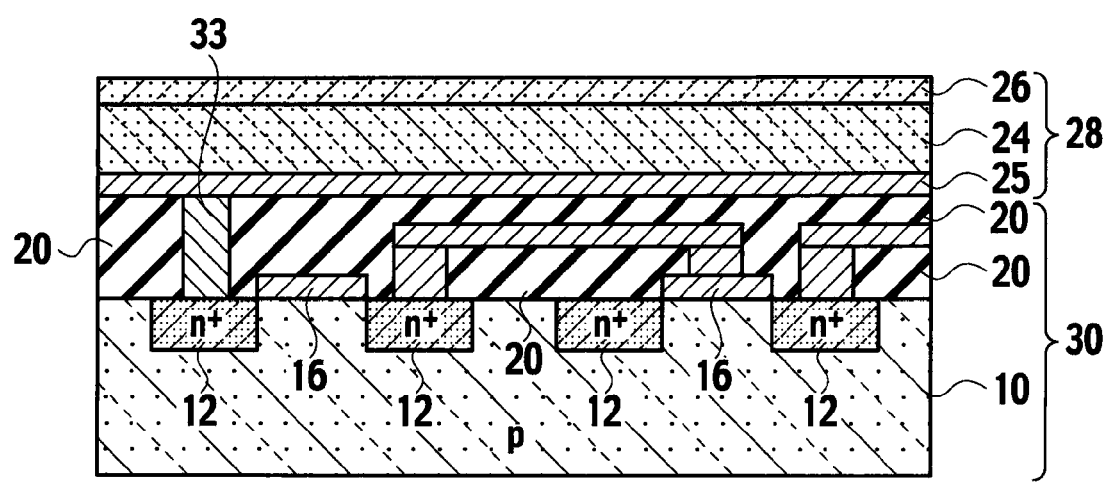
[FIG. 15] It is a schematic cross-sectional configuration diagram of one pixel part of a solid state imaging device according to a modified example of the second embodiment of the present invention.

As shown in FIG. 15 as a cross-sectional view of one pixel part, a solid state imaging device according to the modified example of the second embodiment of the present invention includes: a circuit unit 30 formed on a semiconductor substrate 10; and a photoelectric conversion unit 28 including a lower electrode layer 25 placed on the circuit unit 30, a compound semiconductor thin film (Cu(In$_X$, Ga$_{1-X}$)Se$_2$ (where 0<=X<=1)) 24 of chalcopyrite structure which is placed on the lower electrode layer 25 and functions as an optical absorption layer, and an optical transparent electrode layer 26 placed on the compound semiconductor thin film 24.

The lower electrode layer 25, the compound semiconductor thin film 24, and the optical transparent electrode layer 26 are laminated one after another on the circuit unit 30.

The circuit unit 30 includes a transistor by which the lower electrode layer 25 is connected to the source/drain region 12, in the solid state imaging device according to the modified example of the second embodiment of the present invention.

As the lower electrode layer 25, molybdenum (Mo), niobium (Nb), tantalum (Ta), tungsten (W), etc. can be used, for example.

The optical transparent electrode layer 26 is composed of a non-doped ZnO film (i-ZnO) provided in an interface with the compound semiconductor thin film 24, and an n$^+$ type ZnO film provided on the non-doped ZnO film (i-ZnO).

According to this configuration, the void and pinhole which are produced in the CIGS thin film of the underlying are embedded by a semi-insulating layer by providing a non-doped ZnO film (i-ZnO) as the optical transparent electrode layer, and the CIGS thin film and i-p junction is formed, and the generation of leakage current by the tunnel current which occurs when a conductive ZnO film (n$^+$) is contacted the CIGS thin film directly can be prevented. Therefore, the dark current at the pn junction interface can be reduced by forming the non-doped ZnO film (i-ZnO) as a thick film.

Furthermore, as the optical transparent electrode layer 26, other electrode materials are also applicable. For example, an ITO film, a tin oxide (SnO$_2$) film, or an indium oxide (In$_2$O$_3$) film can be used.

In FIG. 15, although the circuit unit 30 is formed with the CMOS integrated circuit, for example, the details of the circuit omit explanation. In FIG. 15, the gate insulating film 14 placed on the semiconductor substrate 10 between the source/drain regions 12 is omitting illustration. Moreover, the VIA electrode 33 is placed between the source/drain region 12 and the lower electrode layer 25.

Moreover, as for the solid state imaging device according to the modified example of the second embodiment of the present invention, the photoelectric conversion cell composed of the circuit unit 30 and the photoelectric conversion unit 28 is integrated by one-dimensional matrix shape or two-dimensional matrix shape.

In a plurality of pixels integrated by one-dimensional matrix shape or two-dimensional matrix shape, the optical transparent electrode layer 26 is formed on the semiconductor substrate surface in one piece, and is performed in common electrically.

That is, in the solid state imaging device according to the modified example of the second embodiment of the present invention, the optical transparent electrode layer 26 becomes a cathode electrode of the photo diode (PD) which composes the photoelectric conversion unit 28, and is achieved by constant potential (for example, power supply voltage). Therefore, in a plurality of pixels integrated by one-dimensional matrix shape or two-dimensional matrix shape, it is not necessary to perform isolation formation of the cathode electrode of the photo diode (PD) which composes the photoelectric conversion unit 28, and it is formed on the semiconductor substrate surface in one piece, and should just be performed in common electrically.

According to the solid state imaging device according to the modified example of the second embodiment of the present invention, whole pixel region of the photoelectric conversion cell is usable as the substantial photoelectric conversion region by the lamination structure of the circuit unit 30 and the photoelectric conversion unit 28. The optical aperture is about 80 to 90%.

In the solid state imaging device according to the modified example of the second embodiment of the present invention, there is no amplifying function for every pixel, compared with the first embodiment, reflecting the difference in the circuit configuration.

On the other hand, since the configuration of the photoelectric conversion unit 28 is the same as that of the solid state imaging device according to the first embodiment, all of the formation processes of the compound semiconductor thin film of the chalcopyrite structure shown in FIG. 5, the composition ratio dependence of the bandgap energy of the compound semiconductor thin film shown in FIG. 9, the photoelectric conversion characteristic shown in FIG. 10, the wavelength characteristic of the quantum efficiency of the compound semiconductor thin film (CIGS thin film) shown in FIG. 11, and the optical absorption characteristics shown in FIG. 12, are the same also in the solid state imaging device according to the second embodiment and its modified example of the present invention. Moreover, the fabrication method after formation of the circuit unit is common also about the fabrication method shown in FIG. 4. Therefore, these explanations are omitted.

According to the solid state imaging device according to the second embodiment and its modified example of the present invention, the solid state imaging device, with an easy structure, having the high sensitivity which reaches the wide wavelength region from visible light to near infrared light wavelength region and reducing dark current can be provided by providing the compound semiconductor film of the chalcopyrite structure composed of Cu(In, Ga)Se$_2$ in the photoelectric conversion unit.

Moreover, according to the fabrication method of the solid state imaging device according to the second embodiment and its modified example of the present invention, since the optical transparent electrode layer can form on the substrate surface in one piece and it does not need to pattern the optical transparent electrode layer, the fabricating process can be simplified.

Moreover, according to the solid state imaging device according to the second embodiment and its modified example of the present invention, the carrier recombination processing can be reduced and the dark current can be reduced by expanding the bandwidth using the CIGS based thin film which replaced a part of In (indium) by gallium.

Moreover, according to the solid state imaging device according to the second embodiment and its modified example of the present invention, the dark current density can be reduced by the order of $10^2$ by the bandgap control by $Cu(In_X, Ga_{1-X})Se_2$ (where $0<=X<=1$).

[Other Embodiments]

The present invention has been described by the first to second embodiments and its modification, as a disclosure including associated description and drawings to be construed as illustrative, not restrictive. With the disclosure, artisan might easily think up alternative embodiments, embodiment examples, or application techniques.

Since the solid state imaging device according to the first to second embodiment of the present invention has high sensitivity also in the near infrared light wavelength region, the solid state imaging device is available enough as an image sensor for a security camera (camera which performs sensing of the visible light at daytime and performs sensing of the near infrared light wavelength region at night), and a personal authentication camera (camera for performing personal authentication with the near infrared light wavelength region which is not affected by an influence of outdoor daylight) or an in-vehicle camera (camera mounted in a car for visual aid at night, distant visual field securing, etc.).

In the solid state imaging device according to the first to second embodiment of the present invention, although $Cu(In_X, Ga_{1-X})Se_2$ (where $0<=X<=1$) is used as the compound semiconductor thin film (CIGS) with chalcopyrite structure, it is not limited to this.

As the CIGS thin film, the thing of composition of $Cu(In_X, Ga_{1-X})(Se_Y, S_{1-Y})$ (where $0<=X<=1$, $0<=Y<=1$) is also known, and it is available also in the CIGS thin film with such composition.

As the compound semiconductor thin film of chalcopyrite structure, other compound semiconductor thin films, such as $CuAlS_2$, $CuAlSe_2$, $CuAlSe_2$, $CuAlTe_2$, $CuGaS_2$, $CuGaSe_2$, $CuGaTe_2$, $CuInS_2$, $CuInSe_2$, $CuInTe_2$, $AgAlS_2$, $AgAlSe_2$, $AgAlTe_2$, $AgGaS_2$, $AgGaSe_2$, $AgGaTe_2$, $AgInS_2$, $AgInSe_2$, and $AgInTe_2$, are applicable.

In the solid state imaging device according to the first to second embodiment of the present invention, a micro lens may be placed on each picture element region and thereby the collection efficiency for every pixel may be raised.

Moreover, although the embodiments having a plurality of pixels have been described, it may not limit to this and may compose as PD (photo diode) having only one light-receiving region, for example.

In the solid state imaging device according to the first to second embodiment of the present invention, although the example which composes the CMOS integrated circuit formed on the semiconductor substrate is mainly described about the circuit unit 30, the circuit unit 30 is not limited to the CMOS and other circuit configurations may be used for the circuit unit 30. For example, the compound semiconductor thin film of the chalcopyrite structure applied with the solid state imaging device according to the first to second embodiment of the present invention may be used for the photoelectric conversion unit 28, and a charge transfer function may be given to the circuit unit as well as CCD (Charge Coupled Device).

In the solid state imaging device according to the first to second embodiment of the present invention, although the semiconductor substrate is mainly explained about the substrate, a thin film may be formed on a glass substrate and the predetermined circuit unit composed of a thin film transistor may be formed on the aforementioned thin film, as an easy configuration.

In the solid state imaging device according to the first to second embodiment and its modified example of the present invention, although the example of the semiconductor is mainly described about the substrate, it does not limit to a mono-crystal substrate as the substrate. A SOI (Silicon On Insulator) substrate may be used for the purpose of low power consumption and improvement in the speed.

Such being the case, the present invention covers a variety of embodiments, whether described or not. Therefore, the technical scope of the present invention is appointed only by the invention specific matter related appropriate scope of claims from the above-mentioned explanation.

According to the solid state imaging device of the present invention, the solid state imaging device, with an easy structure, having the high sensitivity which reaches the wide wavelength region from visible light to near infrared light wavelength region and reducing dark current can be provided by providing the compound semiconductor film of the chalcopyrite structure in the photoelectric conversion unit.

Moreover, according to the fabrication method of the solid state imaging device of the present invention, since the optical transparent electrode layer can form on the substrate surface in one piece and it does not need to pattern the optical transparent electrode layer, the fabricating process can be simplified.

Moreover, according to the solid state imaging device of the present invention, the carrier recombination processing can be reduced and the dark current can be reduced by expanding the bandwidth using the CIGS based thin film composed of $Cu(In, Ga)Se_2$ which replaced a part of In (indium) by gallium.

Moreover, according to the solid state imaging device of the present invention, the dark current density can be reduced by the order of $10^2$ by the bandgap control by $Cu(In_X, Ga_{1-X})Se_2$ (where $0<=X<=1$).

INDUSTRIAL APPLICABILITY

Since the solid state imaging device according to the embodiments of the invention has high sensitivity also in a near infrared light wavelength region, it is available enough as the image sensor for a security camera (camera which performs sensing of the visible light at daytime and performs sensing of the near infrared light wavelength region at night), personal authentication camera (camera for performing personal authentication with the near infrared light wavelength region which is not affected by an influence of outdoor daylight) or in-vehicle camera (camera mounted in a car for visual aid at night, distant visual field securing, etc.), and also an image sensor for near infrared light wavelength region detection of medical application.

What is claimed is:
1. A solid state imaging device comprising:
   a circuit unit formed on a substrate; and
   a photoelectric conversion unit including a lower electrode layer placed on the circuit unit, a compound semiconductor thin film of chalcopyrite structure which is placed on the lower electrode layer and functions as an optical absorption layer, and an optical transparent electrode layer placed on the compound semiconductor thin film, wherein the lower electrode layer, the compound semiconductor thin film, and the optical transparent electrode layer are laminated one after another on the circuit unit, and wherein the compound semiconductor thin film includes a first region and a second region sequentially in a direction from the optical transparent electrode layer toward the substrate, atomic concentration of Ga in the first region is higher than atomic concentration of In in the first region, and atomic concentration of Ga in the second region is lower than atomic concentration of In in the second region.

2. The solid state imaging device according to claim 1, wherein the circuit unit includes a transistor by which the lower electrode layer is connected to a gate.

3. The solid state imaging device according to claim 1, wherein the circuit unit includes a transistor by which the lower electrode layer is connected to a source or a drain.

4. The solid state imaging device according to claim 1, wherein the circuit unit and a photoelectric conversion cell composed of the photoelectric conversion unit are integrated.

5. The solid state imaging device according to claim 1, wherein the circuit unit and a photoelectric conversion cell composed of the photoelectric conversion unit are integrated, and the optical transparent electrode layer is formed on a substrate surface in one piece.

6. The solid state imaging device according to claim 1, wherein the compound semiconductor thin film of the chalcopyrite structure is $Cu(In_X, Ga_{1-X})Se_2$ (where $0<=X<=1$).

7. The solid state imaging device according to claim 1, wherein the optical transparent electrode layer includes a non-doped ZnO film provided on an interface with the compound semiconductor thin film, and an n type ZnO film provided on the non-doped ZnO film.

8. The solid state imaging device according to claim 1, wherein the solid state imaging device is photo sensor having sensitivity also in a near infrared optical wavelength region.

9. The solid state imaging device according to claim 1, wherein the solid state imaging device includes a color filter on the optical transparent electrode layer.

* * * * *